United States Patent
Hilpert et al.

[19]

[11] Patent Number: 5,268,712
[45] Date of Patent: Dec. 7, 1993

[54] APPARATUS AND METHOD FOR SEARCH TUNING OF SATELLITE TELEVISION SOUND CARRIERS

[75] Inventors: Thomas Hilpert, Gundelfingen; Stefan Mueller, Freiburg, both of Fed. Rep. of Germany

[73] Assignee: Deutsche ITT Industries GmbH, Freiburg, Fed. Rep. of Germany

[21] Appl. No.: 877,565

[22] Filed: Apr. 30, 1992

[30] Foreign Application Priority Data

May 3, 1991 [EP] European Pat. Off. ...... 91107238.7

[51] Int. Cl.⁵ .................... H04N 5/60; H04N 5/50
[52] U.S. Cl. .................... 358/192.1; 358/193.1; 358/198; 455/161.3; 455/154.2; 455/191.3
[58] Field of Search ............... 358/191.1, 192.1, 193.1, 358/195.1, 196, 197, 198, 143, 144, 188, 183, 182, 181, 22; 455/164.1, 182.1, 192.1, 19.2, 3, 161.3, 154.2, 158.4, 191.3, 192.2, 161.1, 161.2, 164.2

[56] References Cited
U.S. PATENT DOCUMENTS 4,698,670 10/1987 Matty ........................... 358/86
5,103,313 4/1992 Chan et al. ................. 358/193.1

FOREIGN PATENT DOCUMENTS 0208425 1/1987 European Pat. Off. .
0355172 8/1988 European Pat. Off. .
0356555 8/1988 European Pat. Off. .
3843451 6/1990 European Pat. Off. .
0464328 1/1992 European Pat. Off. .
0047826 4/1992 European Pat. Off. .

OTHER PUBLICATIONS

Patent Abstract of Japan; vol. 12, No. 256 (E-635); Jul. 19, 1988.
Elektronik; Bk. 6; Mar. 16, 1990; pp. 50-56; T. Hilpert U. A.: "Digitaler Multistandard-Audio-Chipsatz, AMU 2481 vs Audio Processor for Video Recorders and Satellite Receivers"; Feb. 18, 1991, ITT Semiconductors, Freiburg, Germany.

Primary Examiner—James J. Groody
Assistant Examiner—Michael H. Lee
Attorney, Agent, or Firm—Thomas L. Peterson

[57] ABSTRACT

Apparatus and method for frequency-tuning the frequency-modulated sound carriers of multichannel sound transmission signals in a satellite television receiver. By utilizing digital signal processing, the audio range of the television satellite channel is searched for the desired sound carrier in steps. Then the FM center frequency is determined by calculating the average amplitude density in each measurement interval.

20 Claims, 4 Drawing Sheets

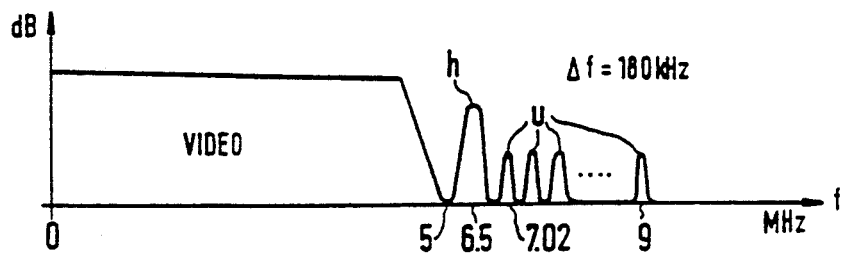
Fig.1
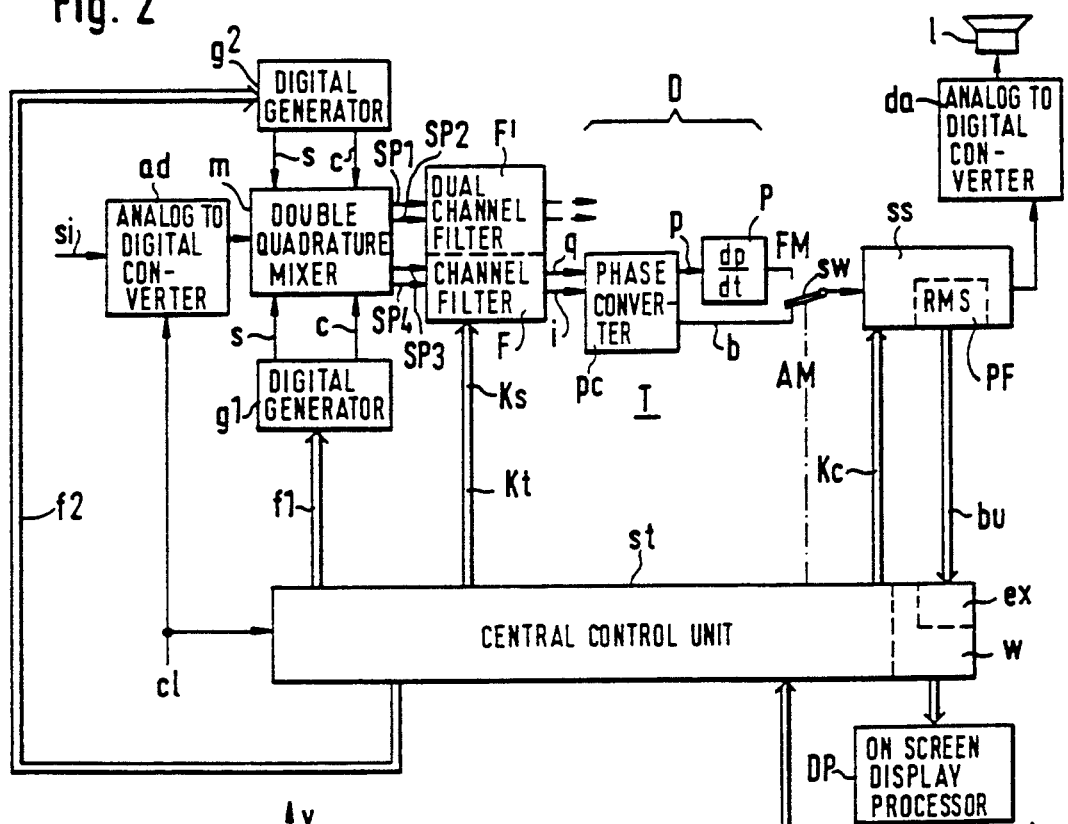
Fig. 2
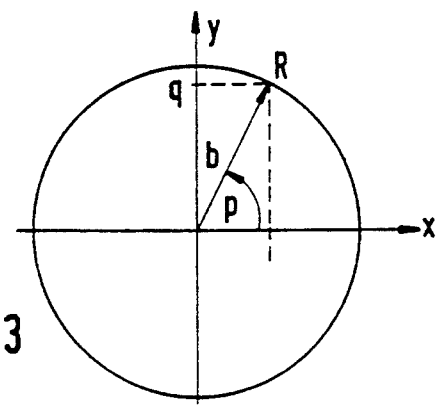
Fig. 3

APPARATUS AND METHOD FOR SEARCH TUNING OF SATELLITE TELEVISION SOUND CARRIERS

FIELD OF THE INVENTION

This invention relates to search tuning of satellite television sound carriers and more particularly, to search tuning of an audio range of a television satellite channel for desired sound carriers by determining the average amplitude density of the sound carriers.

BACKGROUND OF THE INVENTION

Broadcasting television signals by satellite is a common method of providing television service. Typically, communication satellites positioned in earth-synchronous orbits provide television signals to various countries around the world. Efforts have been made to standardize the national television standards of these countries in order facilitate television service. Frequently, however, the national television standards of these countries differ from country to country.

One such standard includes the audio standard for direct reception from satellites for multichannel sound. In order to provide television service to countries with varying audio standards, it is desirable to equip a television receiver so as to provide a multistandard audio receiving capability. In this regard, reference is made to an article entitled "Digitaler Multistandard Audio-Chipsatz", published in Elektronik on Mar. 16, 1990. In addition, reference is also made to "AMU 2481 VS Audio Processor for Video Recorders and Satellite Receivers", published in Intermetall on Feb. 18, 1991.

Generally, present satellite transmission systems for television utilize frequency modulation (FM). A disadvantage with these systems is that the individual FM sound carriers are distributed over numerous different positions within the intermediate sound frequencies. Consequently, in order to facilitate tuning to a specific multisound channel, the user is required to have knowledge of the respective positions of the FM sound carriers. In addition, these systems require that the television receiver is capable of accurately adjusting to the desired heterodyne frequency.

Therefore, it is an object of the present invention to provide search tuning for sound carriers that does not require knowledge of the position of the sound carrier within an intermediate sound frequency range.

SUMMARY OF THE INVENTION

Apparatus for use with a television receiver having frequency modulated sound carriers of multichannel sound transmission standards suitable for television satellite reception using a digital sound processing section for frequency tuning said television receiver, said television receiver including a quadrature mixer, a channel filter having an output, a demodulator coupled to said output, a sound stage and a central control unit which continuously tunes said quadrature mixer by utilizing a frequency programmable digital generator, comprising tuning means coupled to said generator for frequency tuning by use of an automatic search control where the frequency of a heterodyne signal pair is changed in steps and each search tuning frequency step represents a measurement interval, filter switching means coupled to said channel filter for switching the passband of said channel filter by said central control unit to a bandwidth lying between twice and five times the bandwidth of said search tuning frequency step, demodulator switching means coupled to said demodulator for switching by said central control unit to amplitude demodulation, extreme value detection means coupled to an evaluation device and a display device for determining a relative maximum value of an amplitude from adjacent measurement intervals, wherein said relative maximum value is provided to said evaluating device and said display device and is assigned to an associated search tuning frequency step by said central control unit.

BRIEF DESCRIPTION OF THE FIGURES

FIG. 1 shows as an example the frequency spectrum of a TV satellite channel within a baseband;

FIG. 2 is a block diagram of an embodiment of a circuit for carrying out a search tuning method in accordance with the present invention;

FIG. 3 shows a vector diagram of an in-phase signal and a quadrature signal of a sound carrier;

DETAILED DESCRIPTION

Figure 4:
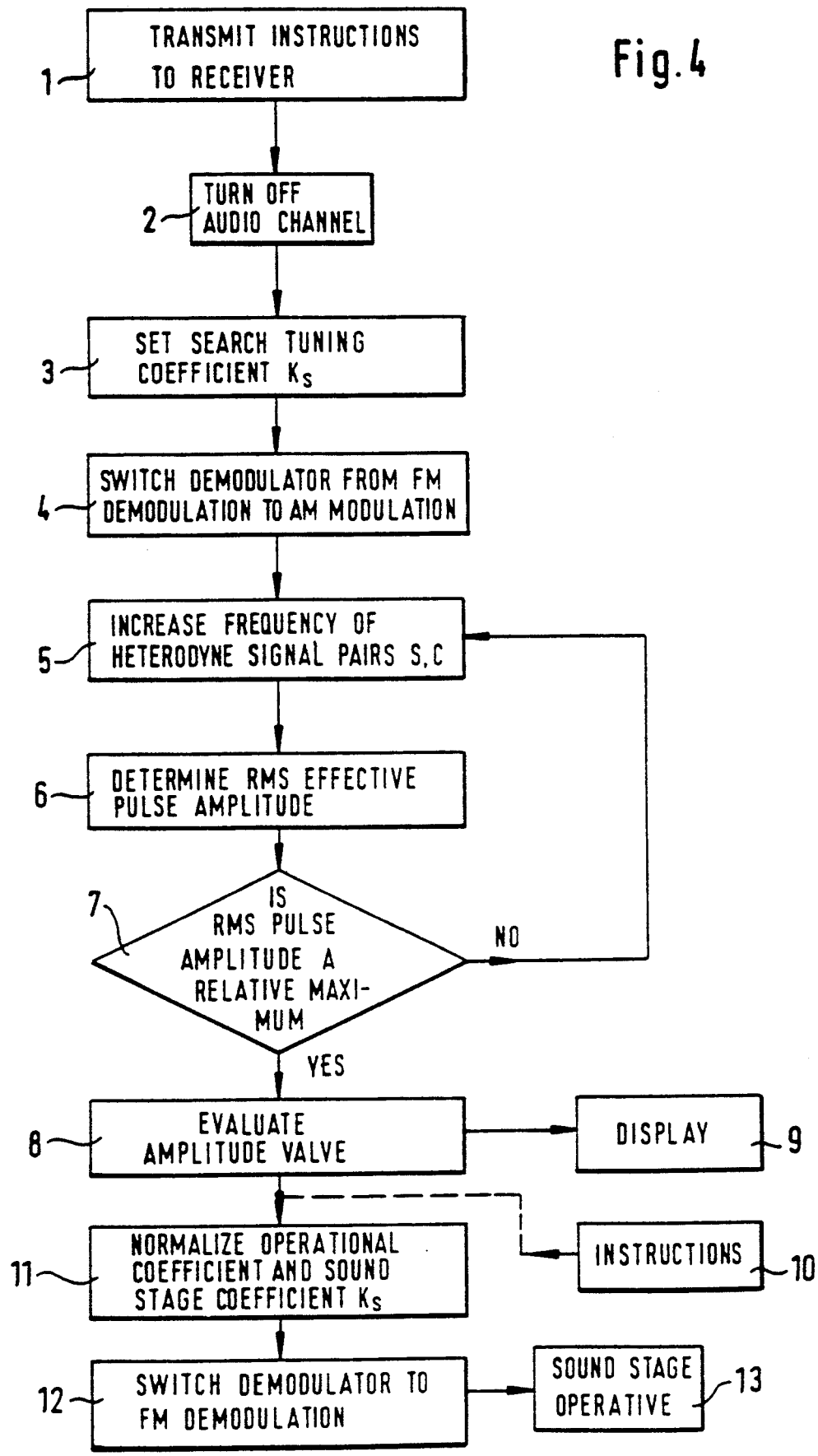
FIG. 4 is a flow diagram of a search tuning method.

Referring to FIG. 1, a frequency spectrum of a television satellite channel within a baseband is shown. As can be seen, the video frequency range extends to approximately 5 MHz and the adjoining sound intermediate frequency range extends to approximately 9 MHz. The frequency spectrum includes a main carrier h having a monophonic signal at 6.5 MHz. The frequency spectrum further includes subcarriers u which are sound carriers and have either a stereo signal component or other signal information. The subcarriers u extend between 6.5 MHz and 9 MHz in the frequency spectrum and are spaced 180 KHz apart.

Referring to FIG. 2, a block diagram of a search tuning circuit in accordance with the present invention is shown. An analog to digital converter ad for digitizing signals is coupled to a double quadrature mixer m. The double mixer m is utilized since two FM sound carriers are demodulated in order to provide stereo reproduction. Digital generators g1,g2 are coupled to the double mixer m. Each digital generator g1,g2 includes an accumulator having a read only memory table with sine and cosine values. A central control unit st is coupled to each digital generator g1,g2 and provides corresponding first f1 and second f2 data words during each pulse of the system clock cl to the digital generators g1,g2. The double mixer m is then coupled to a dual channel filter F' which includes a channel filter F.

In operation, an input analog signal si is provided to an input of the analog to digital converter ad. The analog signal si includes at least the entire audio signal range, which, as can be seen from FIG. 1, extends from approximately 5.5 MHz to approximately 9.2 MHz. The analog to digital converter ad digitizes the analog signal, thus producing a digital signal which is then provided to an input of the double mixer m.

The most significant bits of the first f1 and second f2 data words correspond to an instantaneous phase angle between 0 and 360 degrees. The accumulator then determines the sine and cosine values for the phase angle represented by the most significant bits of the first f1 and second f2 data words in an accumulator cycle. The digital generators g1,g2 generate a pair of heterodyne signals s,c corresponding to the sine and cosine values that are then provided to data inputs of the double mixer m. The first f1 and second f2 data words control the frequency of the heterodyne signals s,c which corresponds to the frequency of the accumulator cycle. The double mixer m then processes the signal and provides two quadrature signal pairs sp1,sp2,sp3 and sp4 to the dual channel filter F'.

The present invention will now be described by reference to channel filter F only, which is coupled to the previously described digital generator g1 and to a sound channel processing circuit T. During FM demodulation, the bandwidth of channel filter F extends from approximately 130 kHz to approximately 380 kHz. However, during search tuning in accordance with the present invention, the bandwidth is changed to extend from approximately 20 KHz to approximately 50 KHz by utilizing corresponding search tuning coefficients Ks. As will be explained hereinafter, the capability to change the bandwidth of channel filter F is provided by the sound channel processing circuit T. In addition, the bandwidth may be adapted to different operating conditions depending on whether a main carrier h or subcarrier u is to be filtered by utilizing alternate operational coefficients Kt.

An output of channel filter F provides a quadrature signal pair having an in-phase signal i and a quadrature phase signal q to the sound channel processing circuit T. Referring to FIG. 3, the in-phase signal i and quadrature phase signal q are shown in a Cartesian coordinate system having axes x and y. As can be seen, the in-phase angle i and quadrature phase signal q are orthogonal. It is understood that the in-phase angle i and the quadrature phase signal p are a rectangular component representation of a resultant signal R having a length determined by magnitude b. Moreover, the resultant signal R forms a phase angle (phase) p with respect to a reference phase. If the frequency of the heterodyne signal s,c pair previously described coincides with an average frequency of an FM modulated carrier, the phase p represents the instantaneous phase deviation of the received FM signal from an average sound carrier phase.

The channel processing circuit T includes a demodulator D that is coupled to an electronic changeover switch sw. The demodulator includes a phase converter pc. The phase converter pc processes the in-phase signal i and the quadrature phase signal q to form the previously described phase p. The demodulator D then differentiates the phase p with respect to time to provide a desired FM demodulation signal as is well known in the art. This signal is then provided to an FM input of the changeover switch sw.

In addition, the phase converter pc transmits magnitude b of resultant R to an AM input of the changeover switch sw. Phase converters are known in the art and typically use iterative processes to determine phase and magnitude of the quadrature signals. One such process is commonly known as the CORDIC technique. Other types of phase converters use stored table values or perform a simplified series expansion to determine the phase and magnitude.

The changeover switch sw is connected to a sound stage ss. The sound stage ss includes an adaptive deemphasis network and filtering devices (not shown). The central control unit st is coupled to the sound stage ss and provides sound stage coefficients Kc that control the filtering devices. An output of the sound stage ss is coupled to a digital to analog converter da which is then coupled to a loudspeaker l. The sound stage ss further includes a filter PF which is coupled by data bus bu to the central control unit st. The filter PF has a time constant that ranges from approximately 1 Hz to 300 Hz. It is understood that the PF filter is also known as a root mean square (RMS) detector.

In operation, the changeover switch sw is positioned such that the input AM is coupled to the sound stage ss. Consequently, magnitude b is provided to the sound stage ss. The filter PF evaluates the amplitude values provided by the sound stage ss and determines the average amplitude level of the demodulated FM signal. The output value of the filter PF is then provided to the central control unit by the data bus bu. The central control unit st optimizes the sound stage coefficients Kc for utilization by the deemphasis network in accordance with values provided by the filter PF. The sound stage ss then provides a digital output to the digital to analog converter da which causes the speaker l to operate. It is understood that during the search tuning process the sound stage ss is disabled.

The central control unit st includes an extreme value detector ex and an evaluating device w. The extreme value detector determines the relative maximum amplitude during the search tuning process. If two or more relative maxima are present, the evaluating device w determines which maximum is the main carrier h and which is a subcarrier u. In addition, the evaluating device determines which operational coefficients Kt and which sound stage coefficients Kc are to be selected at the end of the search tuning process. The evaluating device w accomplishes this by determining the associated frequency of the heterodyne signal pair s,c and the absolute amplitude.

Since the filter PF has a relatively low time constant (i.e. 1 Hz to 300 Hz) the data clock rate of the filter PF is relatively slow. Consequently, the central control unit st may be programmed to detect an extreme value. A technique for determining an extreme value includes calculating the difference between adjacent average amplitudes which results in either a positive or negative value. A relative maximum amplitude occurs when the difference between successive adjacent amplitudes changes from a positive value to a negative value or vice versa.

In addition, the evaluating device w utilizes the absolute RMS values of the filter PF to determine whether the maxima are main carriers or subcarriers. Depending on the decision, the evaluating device assigns suitable operational coefficients Kt for the bandwidth of the sound channel filter F as well as sound channel coefficients Kc for the deemphasis network in sound stage ss.

The evaluating device w further includes a read only memory table and is coupled to an on screen display processor DP. The on screen display processor DP is coupled to a screen bs of a television receiver. The television receiver is coupled by an instruction bus bi to the central control unit st. The read only memory table includes data which is provided to the on screen display processor DP. Such processors are typically used to provide teletext displays. In the present invention, the on screen display processor DP provides high resolution graphic displays to the screen bs by utilizing pixel control. Consequently, the screen bs provides a display S which may be combined with a menu control. The display S may be an alphanumeric display or an indicator light. A remote control transmitter ge is utilized to transmit individual instructions to the television receiver, which then transmits the instructions over the instruction bus bi to the central control unit st.

Figure 6:
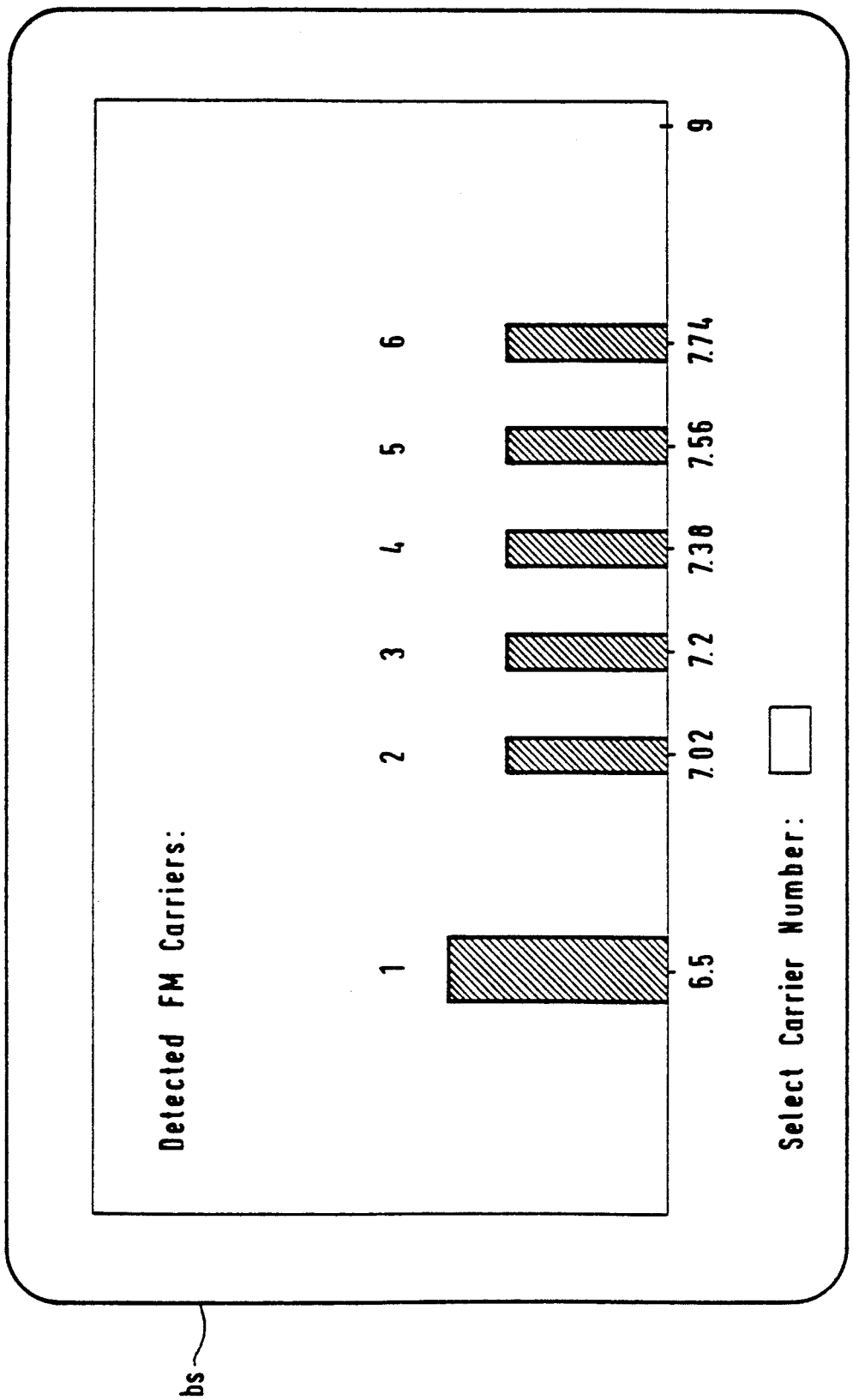
FIG. 6 shows an example of a menu display of sound carriers that a user may select.

Referring to FIG. 6, a bar chart representation of the sound carriers on screen bs is shown. It is understood that techniques may be utilized to represent the sound carriers. In FIG. 6, the horizontal axis represents the sound carrier center frequencies. In addition, the individual sound carriers are numbered consecutively above the associated bar. The main carrier is designated by number 1 and the subcarriers are numbered 2 through 6. As can be seen, main carrier 1 is clearly distinguishable from the subcarriers 2 through 6. In the lower portion of the display area, the user is prompted to select a carrier number. If the selected carrier enables stereo reception, the next prompt could give the option of choosing monophonic or stereo.

FIG. 4 is a flow diagram depicting a method of search-tuning in accordance with the present invention. In step 1, search tuning is initiated by utilizing the remote control transmitter ge to transmit instructions to the television receiver. In step 2, the audio channel is disabled, and in step 3, the search-tuning coefficients Ks for the channel filter F are set and the bandwidth is reduced to the search-tuning value. In step 4, the demodulator D is switched to AM demodulation. Referring to FIG. 3, this is accomplished by setting the electronic changeover switch sw to position AM.

In step 5, the frequency of the heterodyne-signal pair s, c is increased by 10 kHz. The central control unit st then changes the first data word f1 by a value corresponding to the desired search-tuning step. In step 6, the RMS effective pulse amplitude in the measurement interval is determined. Referring to FIG. 2, this is achieved by the filter PF.

Step 7 is a decision step wherein it is decided whether the RMS pulse amplitude represents a relative maximum. If it is not a relative maximum, the method returns to step 5 wherein the frequency of the heterodyne signal pairs s,c are increased by 10 KHz. If the RMS pulse amplitude is a relative maximum, the method proceeds to step 8. In step 8, the amplitude value from step 7 is evaluated to determine from the associated frequency or the absolute amplitude whether the sound carrier is a main carrier h or a subcarrier u. This is then presented on a display device in step 9. The display device may be a simple indicator light or an alphanumeric display. Whether the sound carrier found is already the desired sound carrier is determined in step 10, by which the audio reproduction of this sound carrier is activated. If the sound carrier is not the desired carrier, which is determined by listening, the search process returns to step 1 and the method process is repeated.

Step 11 includes the normalization of the operational coefficients Kt of the channel filter F and the soundstage coefficients Kc of the sound stage ss upon termination of the search process and before audio reproduction. In step 12, the demodulator D is switched to FM demodulation, and step 13 renders the sound stage ss operative again.

Figure 5:
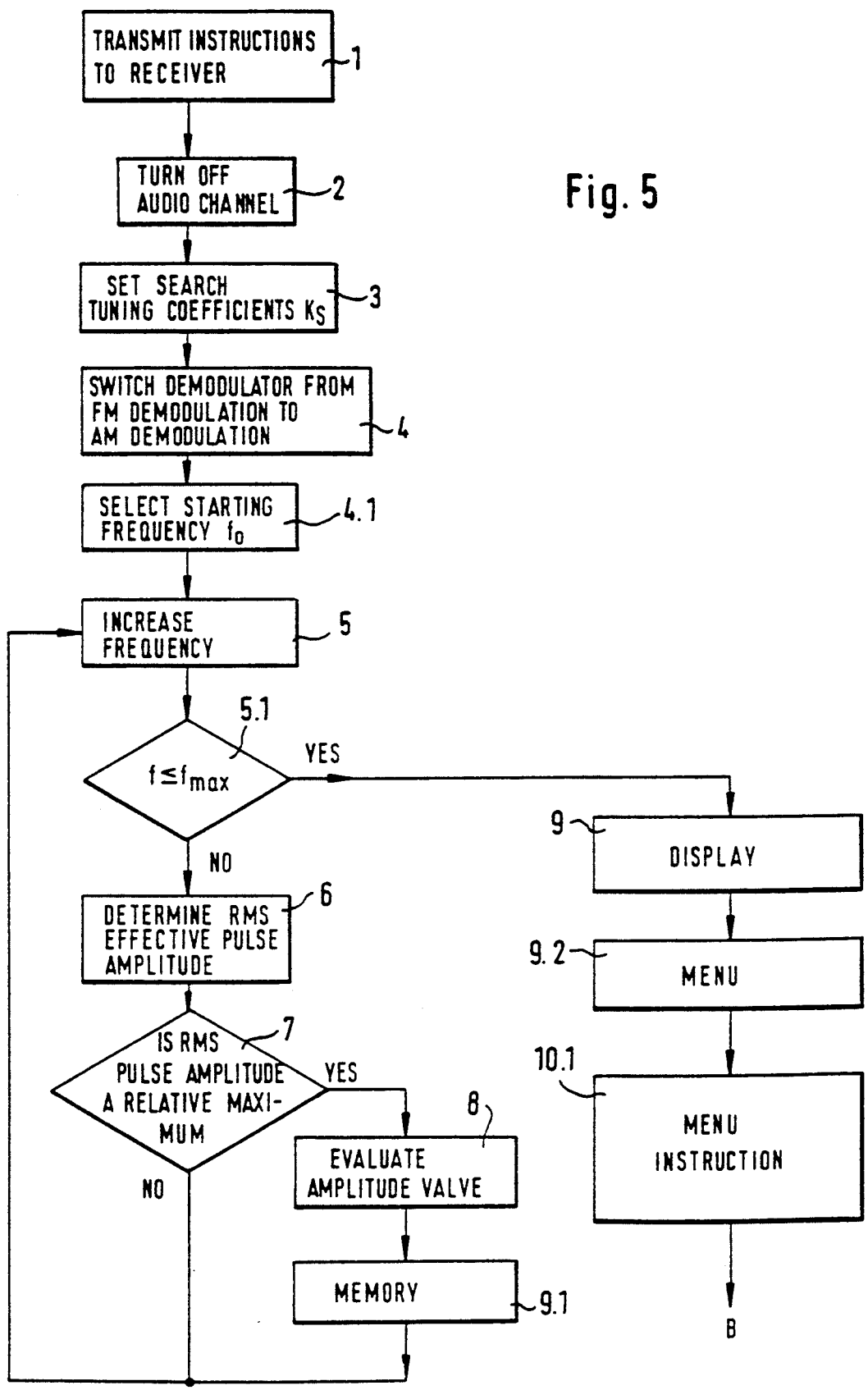
FIG. 5 is a flow diagram of an alternate search tuning method.

FIG. 5 shows a flow diagram of a second search tuning method in accordance with the present invention which affords greater operator convenience. For clarity, like steps in FIGS. 4 and 5 are designated by like reference characters.

In the method described in FIG. 5, search tuning begins at a starting frequency fo of approximately 5 MHz and is continuous to a maximum frequency fmax of approximately 9 MHz. In addition, the carriers and a menu are shown on the screen of the television receiver, enabling the selection of desired sound carriers.

The flow diagram of FIG. 5 begins with previously described steps 1 to 4. In new step 4.1, the starting frequency fo is selected. In step 5 the search tuning frequency f is increased in each iteration and compared with the maximum frequency fmax in step 5.1. Typically, the maximum frequency fmax is selected as approximately 9 MHz. If the maximum frequency fmax is not reached, any relative amplitude maximum that may be present will be detected and evaluated by steps 6, 7 and 8 as previously described. This relative maximum and its associated frequency and absolute amplitude value is stored in a memory device in step 9.1.

If in step 5.1 the maximum frequency fmax is reached, the information in the memory device will be displayed on the screen in step 9, the display being controlled by the on screen display processor DP explained in the description of FIG. 2. The on screen display is supplemented in step 9.2 by a menu inquiry which enables a selection from displayed sound carriers. An example of such a combined display is shown in FIG. 6.

The response to the menu inquiry is made in step 10.1 by entering a digit identifying the sound carrier to be selected. By utilizing a corresponding menu instruction, this digit also initiates in the central control unit st the performance of previously described steps 11 to 13 which are not shown in FIG. 5 but occur after point B.

What is claimed is:

1. Apparatus for use with a television receiver having frequency modulated sound carriers of multichannel sound transmission standards suitable for television satellite reception using a digital sound processing section for frequency tuning said television receiver, said television receiver including a quadrature mixer, a channel filter having an output, a demodulator coupled to said output, a sound stage and a central control unit which continuously tunes said quadrature mixer by utilizing a frequency programmable digital generator, comprising:

tuning means coupled to said generator for frequency tuning by use of an automatic search control where the frequency of a heterodyne signal pair is changed in steps and each search tuning frequency step represents a measurement interval;
filter switching means coupled to said channel filter for switching the passband of said channel filter by said central control unit to a bandwidth lying between twice and five times the bandwidth of said search tuning frequency step;
demodulator switching means coupled to said demodulator for switching by said central control unit to amplitude demodulation;
extreme value detection means coupled to an evaluating device and a display device for determining a relative maximum value of an amplitude from adjacent measurement intervals, wherein said relative maximum value is provided to said evaluating device and said display device and is assigned to an associated search tuning frequency step by said central control unit.

2. The apparatus according to claim 1, wherein said quadrature mixer provides in-phase and quadrature phase signals having a resultant signal and said demodulator includes a phase converter and a differentiator which determine a respective phase and a respective magnitude of said resultant signal.

3. The apparatus according to claim 1, wherein said television receiver further includes a screen and said display device provides a graphic or alphanumeric display on said screen.

4. The apparatus according to claim 3, wherein said display on said screen further includes a menu and a menu control enabling a user to select available television sound carriers.

5. The apparatus according to claim 4, wherein said screen and said sound carriers are identified by a symbol and are displayed in bar graph form as a function of frequency and said sound carriers are selected by a menu control referencing said symbol.

6. The apparatus according to claim 4, wherein said display on said screen is provided by a high resolution pixel control.

7. The apparatus according to claim 6, wherein said television receiver includes a pixel oriented on screen display processor for providing said high resolution pixel control.

8. The apparatus according to claim 1, wherein said sound stage includes a filter device coupled to the central control unit by a data bus, and said central control unit includes said extreme value detecting means and said evaluating device, and said relative maximum value is provided to said filter device and said filter device provides an output to said central control unit.

9. The apparatus according to claim 8, wherein said filter is a root mean square detector having a time constant between approximately 1 Hz and 300 Hz.

10. The apparatus according to claim 1, wherein said central control unit provides operational and sound stage coefficients and said evaluating device calculates a ratio of said amplitude values and distinguishes between main carriers and subcarriers based on said ratio and wherein said evaluating device adjusts an FM bandwidth of said channel filter and a deemphasis in said sound stage by utilizing said operational and sound stage coefficients.

11. Method for use with a television receiver having frequency modulated sound carriers of multichannel sound transmission standards suitable for television satellite reception using a digital sound processing section for frequency tuning said television receiver, said television receiver including a quadrature mixer, a channel filter having an output, a demodulator coupled to said output, a sound stage and a central control unit which continuously tunes said quadrature mixer by utilizing a frequency programmable digital generator, comprising the steps of:

frequency tuning by use of an automatic search control the frequency of a heterodyne signal pair provided by a generator in steps wherein each search tuning frequency step represents a measurement interval;

switching the passband of a channel filter by a central control unit to a bandwidth lying between twice and five times the bandwidth of said search tuning frequency step;

changing a demodulator to amplitude demodulation by said central control unit;

determining a relative maximum value of an amplitude from adjacent measurement intervals, wherein said relative maximum value is provided to an evaluating device and a display device and is assigned to an associated search tuning frequency by said central control unit.

12. The method according to claim 11 further including the step of providing from said quadrature mixer in-phase and quadrature phase signals having a resultant signal and determining a respective phase and a respective magnitude of said resultant signal from a phase converter and a differentiator included in said demodulator.

13. The method according to claim 11 further including the step of displaying a graphic or alphanumeric display on a screen included in said television receiver.

14. The method according to claim 13, including the step of further displaying a menu on said screen enabling a user to select available television sound carriers via a menu control.

15. The method according to claim 14, further including the step of selecting symbols on said menu control corresponding to said sound carriers, wherein said sound carriers are displayed in bar graph form as a function of frequency.

16. The method according to claim 14, further including the step of providing high resolution pixel control for said display on said screen.

17. The method according to claim 16, including providing a pixel oriented on screen display processor in said television for receiver for providing said high resolution pixel control.

18. The method according to claim 11, further including the step of transmitting said relative maximum value to a filter device in said sound stage, said filter device providing an output transferred over a data bus to said central control unit, wherein said central control unit includes said evaluating device and an extreme value detecting means.

19. The method according to claim 18, further including the step of providing in said filter a root mean square detector having a time constant between approximately 1 Hz and 300 Hz.

20. The method according to claim 11, further including the step of distinguishing between main carriers and subcarriers based on a ratio determined by said evaluating device and said extreme value detecting means and automatically adjusting by means of said central control unit an FM bandwidth of a channel filter and providing deemphasis in said in said sound stage by utilizing operational and sound stage coefficients, respectively.

* * * * *